United States Patent
Ali

(10) Patent No.: US 7,023,281 B1
(45) Date of Patent: Apr. 4, 2006

(54) STABLY-BIASED CASCODE NETWORKS

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 117 days.

(21) Appl. No.: 10/897,594

(22) Filed: Jul. 23, 2004

(51) Int. Cl.
    *H03F 3/04* (2006.01)
(52) U.S. Cl. ........................... 330/311; 330/285
(58) Field of Classification Search ............ 330/311, 330/285, 296, 288
    See application file for complete search history.

(56) References Cited

U.S. PATENT DOCUMENTS

| | | | | |
|---|---|---|---|---|
| 4,829,266 | A | * 5/1989 | Pernici et al. | 330/253 |
| 5,025,226 | A | * 6/1991 | Taylor | 330/277 |
| 5,311,115 | A | 5/1994 | Archer | 323/315 |
| 5,323,121 | A | 6/1994 | Butler | 330/252 |
| 5,523,718 | A | 6/1996 | Butler | 330/255 |
| 5,648,743 | A | * 7/1997 | Nagaya et al. | 330/252 |
| 6,107,885 | A | 8/2000 | Miguelez et al. | 330/276 |
| 6,211,659 | B1 | 4/2001 | Singh | 323/315 |
| 6,362,688 | B1 | 3/2002 | Au | 330/261 |
| 6,400,185 | B1 | 6/2002 | Pavan | 327/54.3 |

OTHER PUBLICATIONS

Razavi, Behzad, "Design of Analog CMOS Integrated Circuits", McGraw Hill, preview edition, 2000, pp. 133-139.

"Analog Microelectronics, Advanced Current Mirrors and OpAmp Design" Microlab, vlsi28, 12 pages.

Minch, Bradley A., "A Low-Voltage MOS Cascode Current Mirror for All Current Levels", Mixed Analog-Digital VLSI Circuits and Systems Lab, Cornell University, Ithaca, NY, Aug. 6, 2002.

* cited by examiner

*Primary Examiner*—Henry Choe
(74) *Attorney, Agent, or Firm*—Koppel, Jacobs, Patrick & Heybl

(57) ABSTRACT

Cascode bias structures are provided which enhance control of cascode biases over disturbing effects such as temperature and process variations. Because this enhanced control stabilizes the biases over these disturbing effects, the biases can be reduced to thereby expand the cascode's dynamic range and yet assure that the cascode transistors continue to operate in their proper transistor regions.

32 Claims, 7 Drawing Sheets

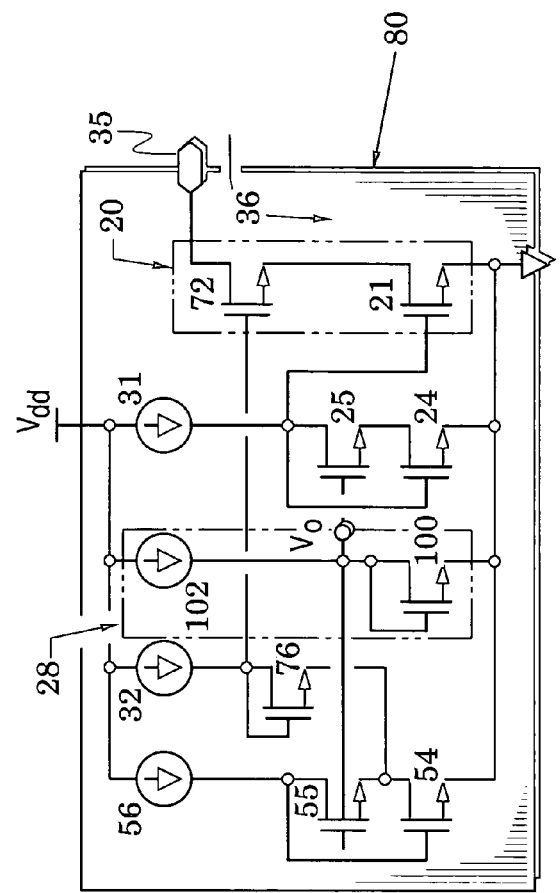
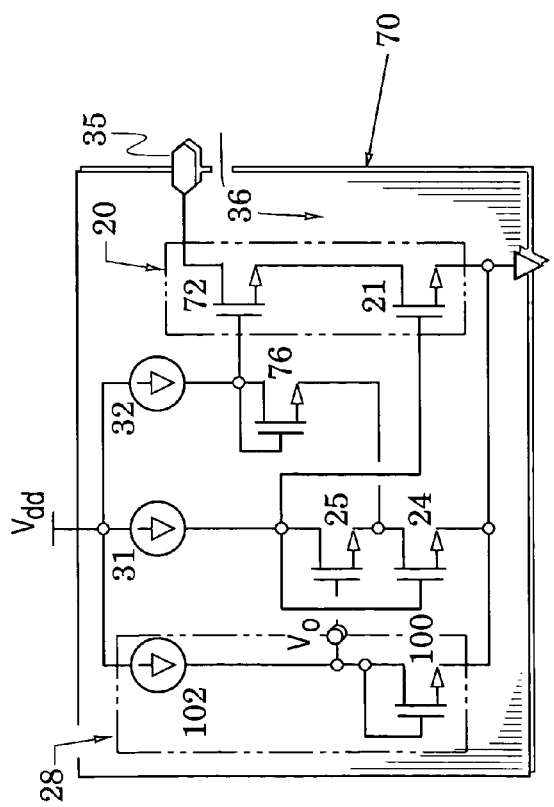
FIG. 4B
FIG. 4A

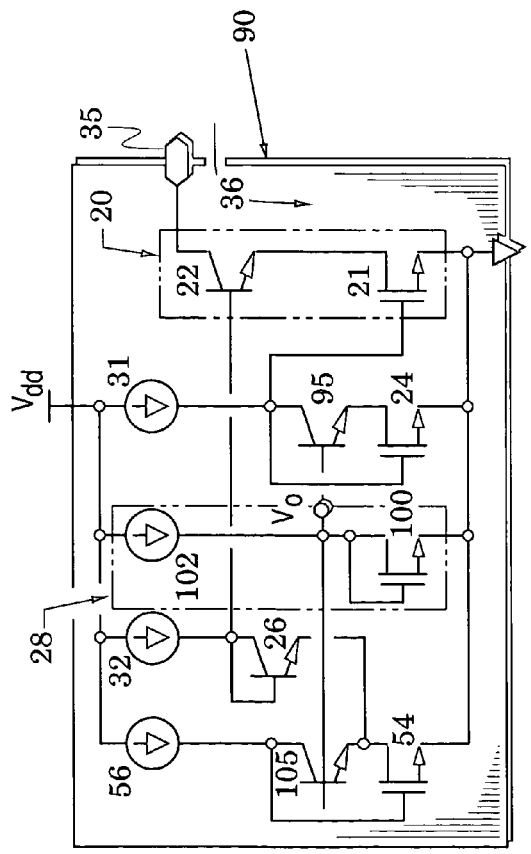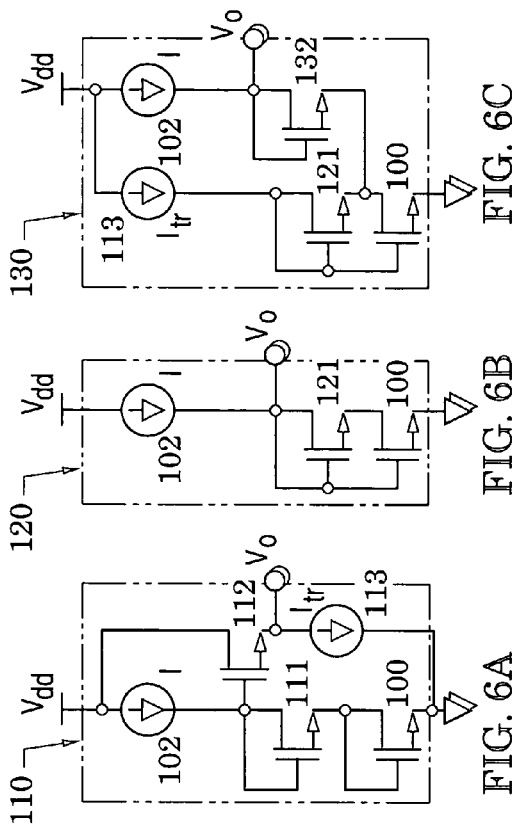

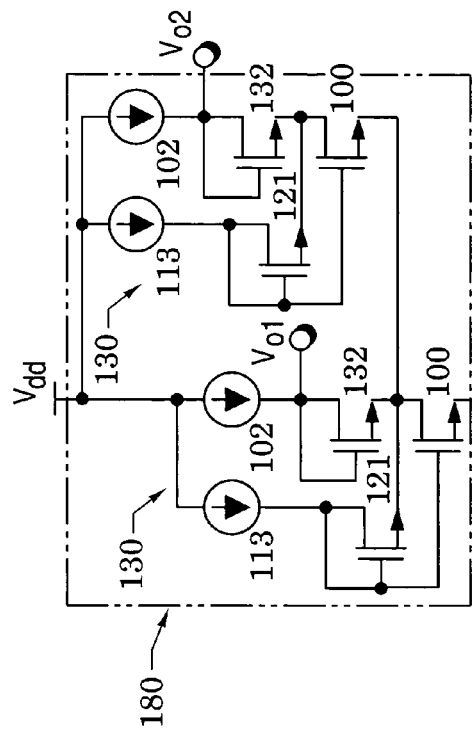
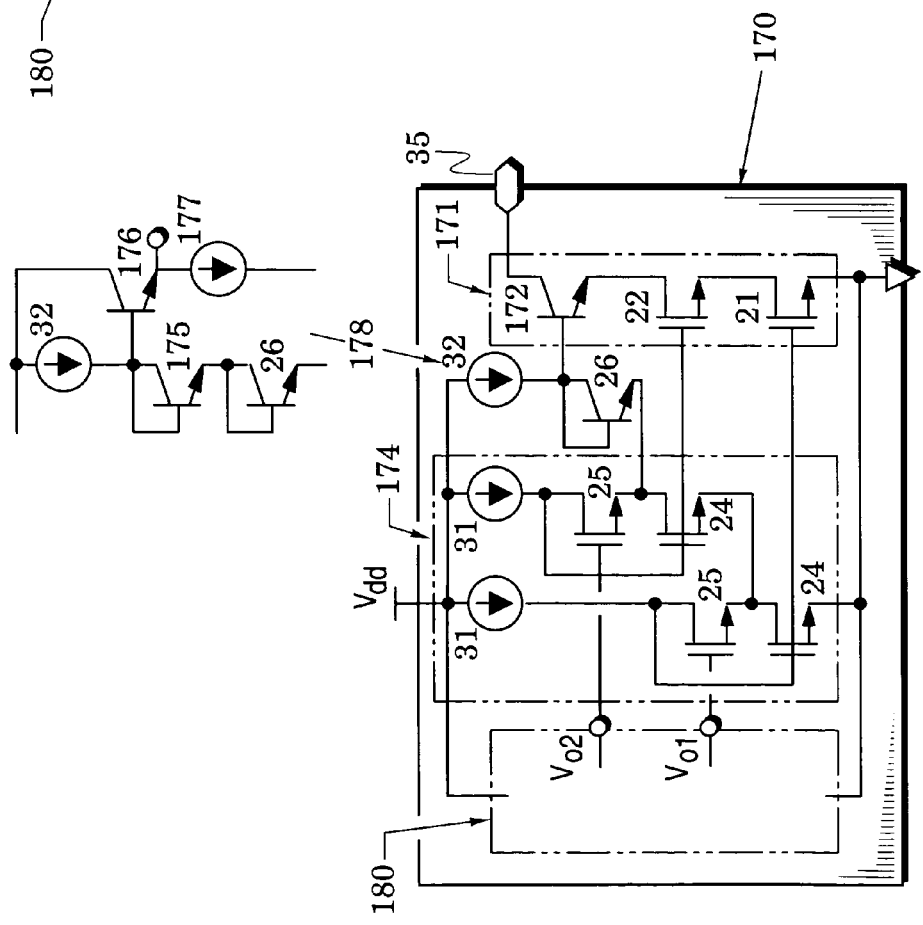
FIG. 9
FIG. 8A

STABLY-BIASED CASCODE NETWORKS

BACKGROUND OF THE INVENTION

1. Field of the Invention

The present invention relates generally to cascode arrangements of transistors.

2. Description of the Related Art

A cascode arrangement 10 of a main transistor 21 and a cascode transistor 22 is shown in FIG. 1. The main transistor is arranged in a common source (alternatively, common emitter) configuration which provides high signal gain and the cascode transistor is arranged in a common base (alternatively, common gate) configuration which enhances transconductance and output resistance. Accordingly, the arrangement 10 provides several important advantages (e.g., high output impedance) to a variety of circuits (e.g., current sources, current mirrors and differential amplifiers) in which it is often used.

Although referenced as a main transistor herein, the main transistor 21 is often described with other names that reflect particular applications of the cascode arrangment 10. In an amplifier application, for example, the main transistor 21 may be considered to be (and named) an input transistor that receives an input signal and, in a current source application, it may be considered to be (and named) a source transistor that generates a current.

To obtain these advantages, the main and cascode transistors must be biased to operate in the correct transistor region (e.g., saturation region of a metal-oxide-semiconductor transistor). The realization of this desired biasing is complicated by various disturbing effects (e.g., temperature and process variations) which act to alter the bias and is further complicated by the reduction of supply voltage (and, thus, dynamic range) that follows from the relentless trend in fabrication processes (e.g., from 0.35 $\mu$m to 0.25 $\mu$m to 0.18 $\mu$m and so on) that produce finer and finer integrated circuit feature sizes.

Although various structures have been proposed for biasing a cascode arrangement, they have generally permitted excessive movement of the cascode biases when subjected to the disturbing effects mentioned above.

BRIEF SUMMARY OF THE INVENTION

The present invention is directed to cascode networks whose dynamic range is enhanced via stable biasing. The novel features of the invention are set forth with particularity in the appended claims. The invention will be best understood from the following description when read in conjunction with the accompanying drawings.

BRIEF DESCRIPTION OF THE DRAWINGS

FIGS. 2A, 2B, 3A, 3B, 4A, 4B and 5 are schematics of cascode network embodiments of the present invention;

FIGS. 6A, 6B and 6C are schematics of voltage source embodiments in the networks of FIGS. 2A, 2B, 3A, 3B, 4A, 4B and 5;

FIGS. 7A, 7B and 7C are schematics of exemplary applications for the cascode networks of the invention;

FIGS. 8A and 8B are schematics of further cascode network embodiments; and

FIG. 9 is a schematic of a voltage source embodiments in the networks of FIGS. 8A and 8B.

DETAILED DESCRIPTION OF THE INVENTION

Cascode bias structures are provided which enhance control of cascode biases over disturbing effects such as temperature and process variations. Because this enhanced control stabilizes the biases over these disturbing effects, the biases can be reduced to thereby expand the cascode's dynamic range and yet assure that the transistors continue to operate in their proper transistor regions. For the sake of clarity, the operation of the cascode embodiments of FIGS. 2A, 2B, 3A, 3B, 4A, 4B and 5 will be investigated subsequent to the following initial description of their structures.

Figure 2A:
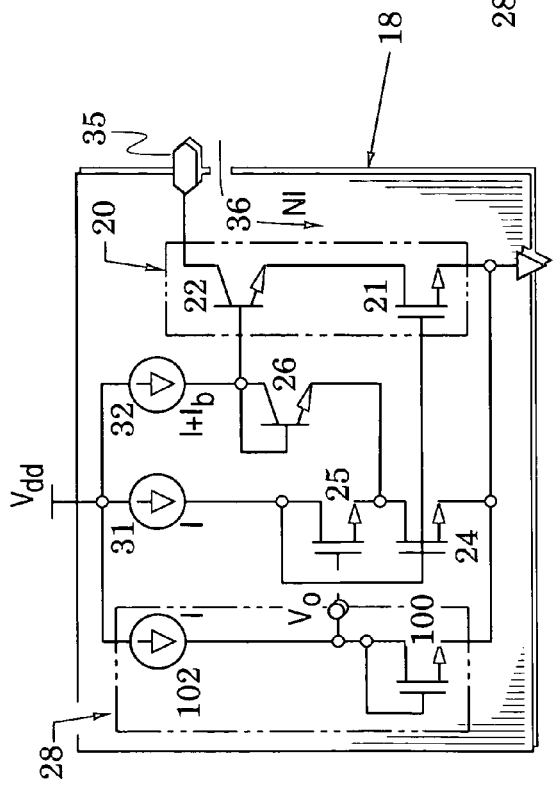

In particular, the cascode network 18 of FIG. 2A includes a cascode arrangement 20 of main and cascode transistors 21 and 22, a replica transistor 24, a compression transistor 25, a diode-coupled transistor 26 and a voltage source 28. The compression transistor 25 is coupled between gate and source of the replica transistor 24 and has a gate that is coupled to receive a voltage from the voltage source 28.

The diode-coupled transistor 26 is coupled to the drain of the replica transistor and the main and cascode transistors 21 and 22 are coupled to respectively receive biases from the replica transistor and the diode-coupled transistor. The compression transistor 25 and the diode-coupled transistor 26 respectively receive currents from current sources 31 and 32 and the cascode transistor draws an output current 36 from an output port 35.

Figure 2B:
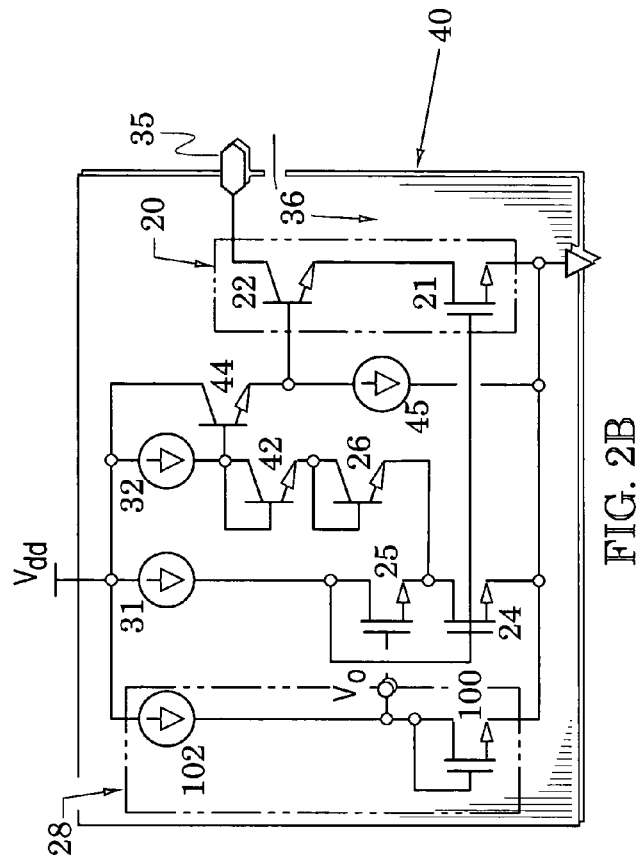

FIG. 2B illustrates another cascode network 40 that includes elements of the network 18 of FIG. 2A with like elements indicated by like reference numbers. In contrast, however, the network 40 inserts a second diode-coupled transistor 42 between the first diode-coupled transistor 26 and the current source 32 and the cascode transistor 22 receives a bias from an emitter follower 44 that is inserted between it and the second diode-coupled transistor. A current source 45 is coupled to the emitter of the emitter follower 44.

Figure 3A:
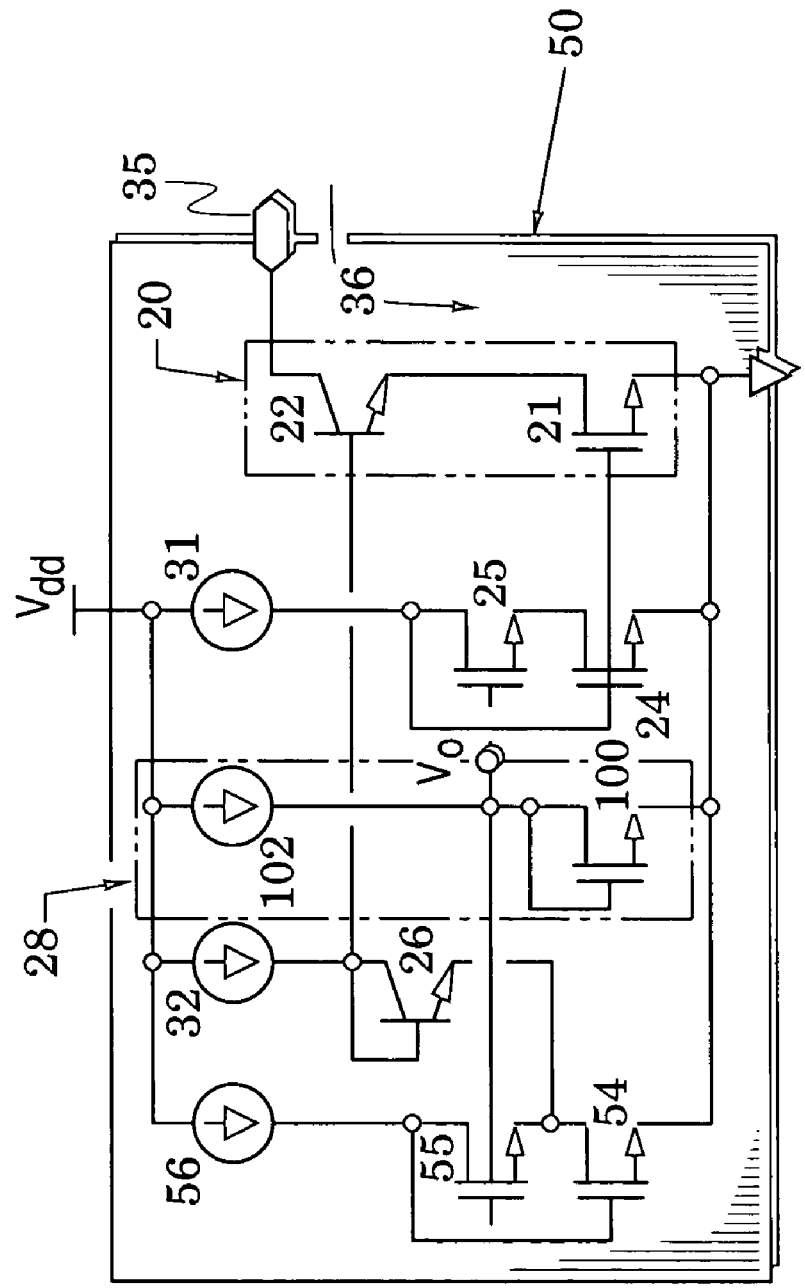

FIG. 3A illustrates another cascode network 50 that includes elements of the network 18 of FIG. 2B with like elements indicated by like reference numbers. The network 50 adds a second replica transistor 54 and a second compression transistor 55 that are mutually arranged similar to the first replica transistor 24 and compression transistor 25 and that receive current from a current source 56. In addition, the diode-coupled transistor 26 is moved from the drain of the first replica transistor 24 to the drain of the second replica transistor 54.

Figure 3B:
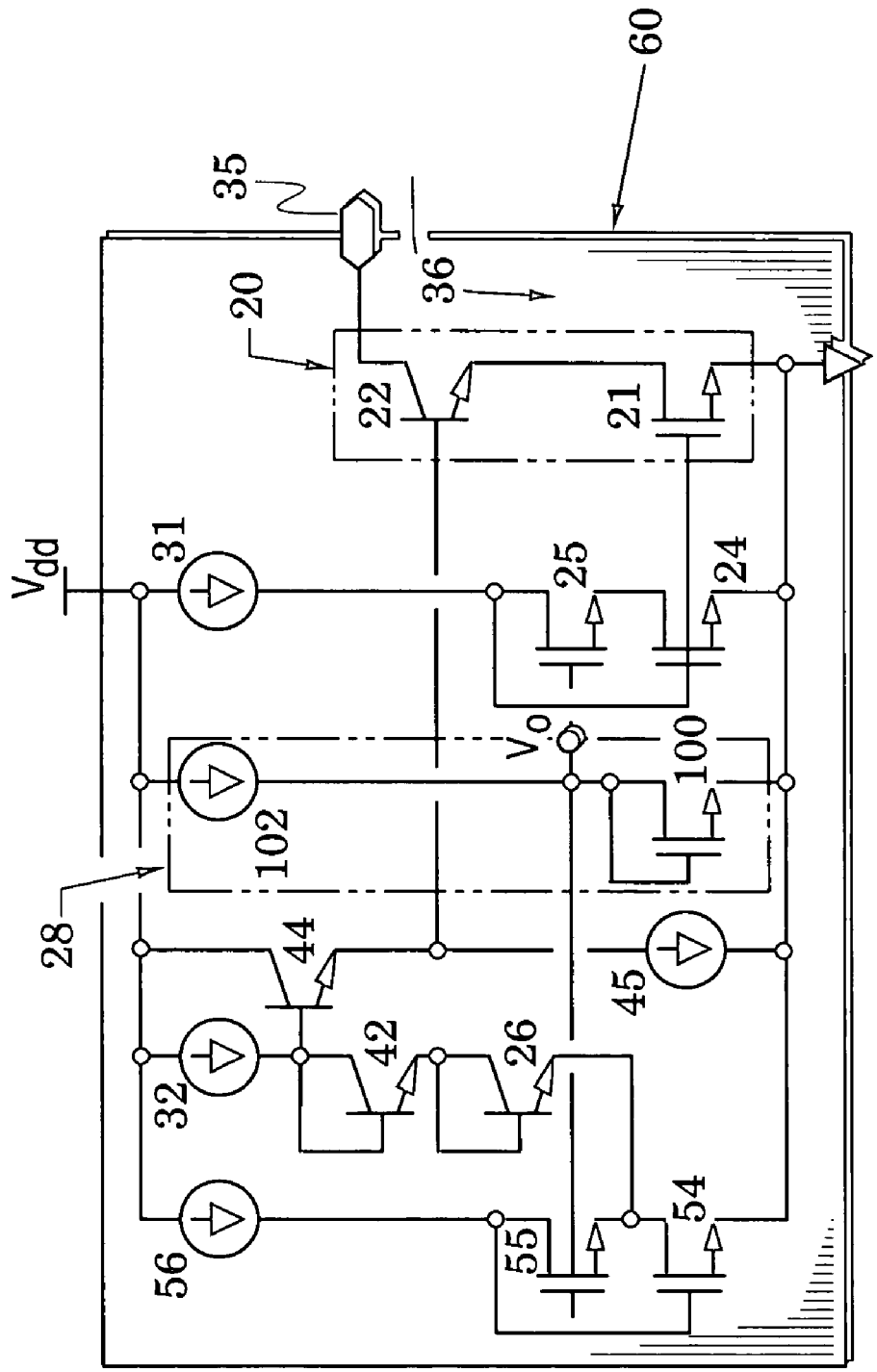

FIG. 3B illustrates another cascode network 60 that includes elements of the network 50 of FIG. 3A with like elements indicated by like reference numbers. In contrast, however, the network 60 inserts the second diode-coupled transistor 42 (introduced in FIG. 2B) between the first diode-coupled transistor 26 and the current source 32 and the cascode transistor 22 receives a bias from the emitter follower 44 (introduced in FIG. 2B) that is inserted between it and the second diode-coupled transistor 42. The current source 45 (introduced in FIG. 2B) is coupled to the emitter of the emitter follower 44.

FIG. 4A illustrates another cascode network 70 that includes elements of the network 18 of FIG. 2A with like elements indicated by like reference reference numbers. The network 70, however, respectively replaces the bipolar junction transistor (BJT) cascode transistor 22 and the BJT diode-coupled transistor 26 with a metal-oxide-semiconductor (MOS) cascode transistor 72 and a MOS diode-coupled transistor 76.

FIG. 4B illustrates another cascode network 80 that includes elements of the network 50 of FIG. 3A with like elements indicated by like reference reference numbers. Similar to the network 70 of FIG. 4A, the network 80 respectively replaces the BJT cascode transistor 22 and the diode-coupled transistor 26 with the MOS cascode transistor 72 (introduced in FIG. 4A) and the MOS diode-coupled transistor 76 (introduced in FIG. 4A).

FIG. 5 illustrates yet another cascode network 90 that includes elements of the network 50 of FIG. 3A with like elements indicated by like reference numbers. The network 50, however, respectively replaces the MOS first and second compression transistors 25 and 55 with BJT first and second compression transistors 95 and 105.

Directing attention now to the operation of these networks, it is first noted that an MOS transistor must be biased past its ohmic or triode region and into its saturation region to realize a high output impedance (i.e., substantially constant current for different drain-to-source voltages $V_{ds}$). For any given gate-to-source voltage $V_{gs}$, the triode region abuts the saturation region at a point where the drain-to-source voltage $V_{ds}$ equals $V_{dsat}$ which is defined as the point where $V_{ds}=V_{gs}-V_t$ wherein $V_t$ is the transistor's threshold voltage (that voltage required to produce an inversion layer beneath the transistor's gate). In the absence of the compression transistor 25 of FIG. 1, the replica transistor 24 would be diode-coupled so that $V_{ds}=V_{gs}$ and, accordingly, the replica transistor would be biased past $V_{dsat}$ by $V_t$ which is on the order of 500 mv for a 0.18 μm MOS fabrication process.

Figure 1:
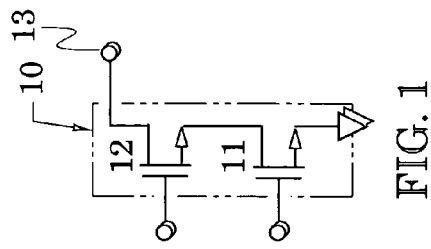
FIG. 1 is a schematic of a cascode arrangement of transistors.

It is anticipated that the main and cascode transistors 21 and 22 of FIG. 1 will pull a current 36 from the output port 35. To reduce current drain, it is desired to carry, in the replica transistor 24 and the compression transistor 25, a much smaller current I that is reduced by a factor N from the current 36 (and is, accordingly, provided by the current source 31). To enhance parameter tracking, it is further desired that current density is similar in the main transistor 21, its corresponding replica transistor 24 and the compression transistor 25 and, accordingly, the replica transistor and the compression transistor are scaled to have a size reduced from the size of the main transistor by the same factor N.

As the current of the current source 31 flows through the compression transistor 25, it establishes a drain current $I_d$ in this transistor which determines a corresponding gate-to-source voltage $V_{gs}$ which is related to the transistor's size. Because the output voltage $V_o$ of the voltage source 28 less the gate-to-source voltage $V_{gs}$ of the compression transistor equals the drain-to-source voltage $V_{ds}$ of the replica transistor, the output voltage $V_o$ can be chosen so that the $V_{gs}$ is compressed closer to $V_{dsat}$. For example, the output voltage $V_o$ may be chosen so that the drain-to-source voltage $V_{ds}$ of the replica transistor is only 100 mv above $V_{dsat}$.

The diode-coupled transistor 26 serves as a replica transistor for the cascode transistor and is scaled to have a size reduced from this transistor's size by the factor N introduced above so that it has the same current density as the cascode transistor 22. The diode-coupled transistor carries the current of the current source 32 which is increased above I by a small amount to supply the base current $I_b$ of the cascode transistor.

Because the BJT transistor 26 is diode coupled, its base-collector junction cannot become forward biased and, hence this transistor is also biased in the correct transistor region (the active region). Because the cascode transistor 22 has the same current density, it will also be biased in the correct transistor region and will transfer the drain voltage of the first replica transistor 24 to the drain of the main transistor 21. Because the main transistor 21 thus has the same gate-to-source voltage $V_{gs}$ and same drain-to-source voltage $V_{ds}$ as the replica transistor 24, its bias is also positioned only 100 mv above $V_{dsat}$ (given the exemplary bias mentioned above.

The drain-to-source voltage $V_{ds}$ of the main transistor 21 is thus urged close to $V_{dsat}$ so that its drain has enhanced dynamic range and the base-to-emitter voltage $V_{be}$ of the cascode transistor is stacked onto this drain so that the collector of the cascode transistor also has enhanced dynamic range. As stated above, the main transistor carries a current density similar to that of the replica transistor and the compression transistor and the cascode transistor carries a current density similar to that of the diode-coupled transistor to thereby enhance bias tracking. Thus, bias tracking over disturbing effects such as temperature and process variations is substantially improved and the main and cascode transistors remain biased in their correct transistor regions (saturation region of the main transistor and active region of the cascode transistor while still providing enhanced dynamic range.

The voltage source embodiment 28 of FIG. 2A is shown to have a diode-coupled transistor 100 that receives a current I from a current source 102. The diode-coupled transistor 100 is sized to provide the desired output voltage $V_o$ in response to the current I. In the embodiment of FIG. 1, the network 18 thus has current sources 31, 32 and 102 that provide similar currents I (with current source 32 preferably providing an additional small current $I_b$). In other network embodiments, the current sources can provide different currents with their corresponding transistors appropriately resized to retain the relationships described above.

In contrast to the cascode network 18 of FIG. 2A, the network 40 of FIG. 2B inserts an emitter follower transistor 44 to add additional isolation between the replica transistor and the cascode transistor 22. The additional base-to-emitter voltage of this transistor is canceled by insertion of the second diode-coupled transistor 42.

The cascode network 50 of FIG. 3A differs from the network 18 of FIG. 2A by moving the diode-coupled transistor to the inserted second replica transistor 55 and second compression transistor 55. Because currents in the first replica transistor 24 and first compression transistor 25 are no longer disturbed by currents of the diode-coupled transistor 26, their accuracy is enhanced.

Similar to the network 40 of FIG. 2B, the network 60 of FIG. 3B inserts an emitter follower transistor 44 to add additional isolation between the replica transistor and the cascode transistor 22. Again, the additional base-to-emitter voltage of this transistor is canceled by insertion of the second diode-coupled transistor 42.

The cascode networks 70 and 80 of FIGS. 4A and 4B provide all MOS versions of the cascode networks 18 and 50 of FIGS. 2A and 3A. The cascode network 90 of FIG. 5 replaces the compression transistors 25 and 55 of FIG. 3A with BJT transistors 95 and 105. Because these transistors are of the same type (BJT) as the diode-coupled transistor 26 and cascode transistor 22 and have similar current densities, they may further enhance bias tracking.

Although the networks of FIGS. 2A, 2B, 3A, 3B, 4A, 4B and 5 are illustrated with the voltage source 28, they may be modified to use other voltage source embodiments. For example, the voltage source 110 of FIG. 6A includes elements of the voltage source 28 with like elements indicated by like reference numbers.

However, a diode-coupled transistor 111 is inserted between the diode-coupled transistor 100 and the current source 102 and the output voltage $V_o$ is provided by a common source transistor 112 that is coupled to the diode-coupled transistor 111. The current of the common source transistor is provided by a current source 113 that generates a small trickle current $I_{tr}$ so that the gate-to-source voltage $V_{gs}$ of this transistor is approximately its threshold voltage $V_t$.

The voltage source 120 of FIG. 6B includes elements of the voltage source 27 of FIG. 1 with like elements indicated by like reference numbers. In this source, a compression transistor 121 is inserted between gate and drain of the transistor 100 to force its drain-to-source voltage closer to $V_{dsat}$.

The voltage source 130 of FIG. 6C includes elements of the voltage source 120 of FIG. 6B with like elements indicated by like reference numbers. However, a diode-coupled transistor 132 has been coupled to the drain of the transistor 100 to provide the output voltage $V_o$. The current source 102 has been moved to supply this added transistor and has been replaced with the trickle current source 113 of FIG. 6A. The diode-coupled transistor 132 is preferably realized as a large transistor and this structure, combined with the small trickle current $I_{tr}$ of the trickle current source 113, further insures that the the gate-to-source voltage $V_{gs}$ of the diode-coupled transistor 132 is approximately its threshold voltage $V_t$.

FIGS. 7A–7C indicate that applications of the cascode networks of the invention include use as an amplifier 140, a current source 150 and a differential amplifier 160. In the amplifier 140, a load 141 is coupled to the cascode transistor 22 and an input signal $S_{in}$ is applied to the main transistor 21 with an output signal provided at the output port 35.

In the current source 150, the cascode transistor 22 provides a current to bias an emitter follower 151 which provides a signal at the output port 35 in response to an input signal $S_{in}$.

In the differential amplifier 160, two cascode transistors 22 steer the current of the main transistor 21 to a differential output port 35 in response to a differential signal $+/-S_{in}$.

FIG. 8A illustrates another cascode network 170 that includes elements of the network 18 of FIG. 2A with like elements indicated by like reference numbers. In contrast, however, the network 170 is directed to a cascode arrangement 171 that inserts a second cascode transistor 172 between the first cascode transistor 22 (renamed to distinguish it from the second cascode transistor) and the output port 35.

In addition, the initial combination of the replica transistor 24, the compression transistor 25 and current source 31 is duplicated to form an added combination which is stacked above the initial combination with the added replica transistor coupled to the drain of the initial replica transistor. The diode-coupled transistor 26 is moved to couple the drain of the added replica transistor to the second cascode transistor 172, the first cascode transistor 22 receives a bias from the added replica transistor and the initial and added compression transistors respectively receive output voltages $V_{o1}$ and $V_{o2}$ from a voltage source 180. The stacked combinations form a bias circuit 174.

In another embodiment of the network 170, a second diode-coupled transistor 175 is coupled to the diode-coupled transistor 26 and an emitter follower 176 with a corresponding current source 177 is inserted between the second diode-coupled transistor and the second cascode transistor. This modification can be substituted as indicated by a substitution arrow 178.

FIG. 9 illustrates a voltage source embodiment 180 for use in the cascode network 170 of FIG. 8A. This voltage source is formed with two of the voltage sources 130 of FIG. 6C wherein one source provides the output voltage $V_{o2}$ and is stacked above the other (which provides the output voltage $V_{o1}$) with the source of the transistor 100 of the upper voltage source coupled to the drain of the transistor 100 of the lower voltage source.

Figure 8B:
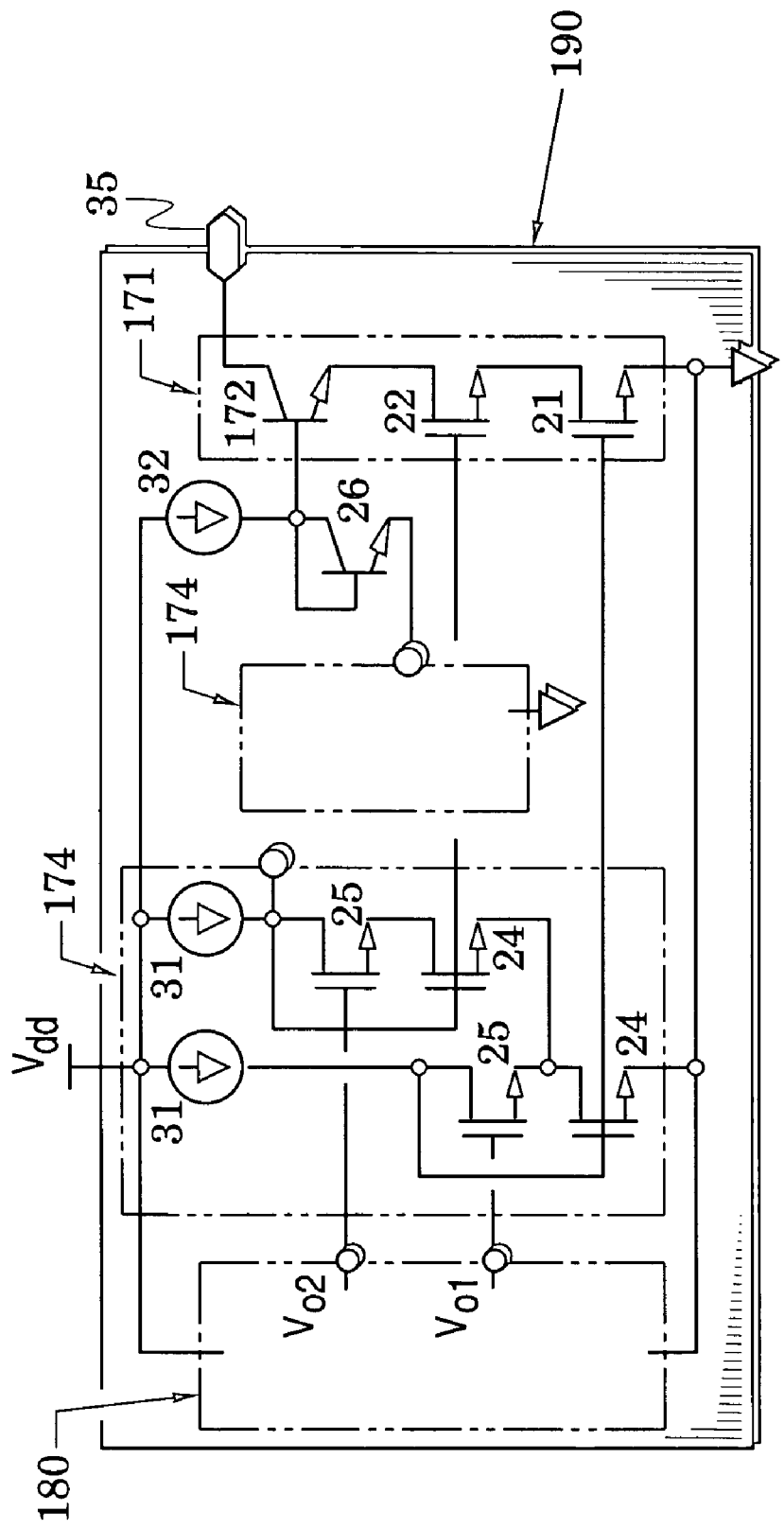

FIG. 8B illustrates another cascode network 190 that includes elements of the network 170 of FIG. 8A with like elements indicated by like reference numbers. The network 190, however, adds a second bias circuit 174 and the diode-coupled transistor 26 is moved to couple to this second bias circuit. Current accuracy is enhanced in the first bias circuit 174 because it no longer has to provide the bias current of the diode-coupled transistor 26.

Performance of the cascode network embodiments of the invention in response to temperature and process variations has been compared in extensive simulations to performance of exemplary conventional bias networks. These conventional networks included:

a) a first network in which the bias of the cascode transistor 22 of FIG. 1 was provided by a voltage source similar to the voltage source 28 of FIG. 1, b) a second network in which the bias of the cascode transistor 22 was provided by an emitter follower transistor that was driven by a diode-coupled transistor positioned between the emitter follower and a third transistor which had a fourth transistor inserted between its gate and drain, and c) a third network similar to the second network but with the third and fourth transistors replaced with the series combination of a resistor and another diode-coupled transistor.

A first simulation observed the bias of the main transistor (21 in FIG. 2A) and noted that it varied less than 140 mv in networks of the invention compared to a range of 255–353 mv for the conventional networks. A second simulation observed the bias of the cascode transistor (22 in FIG. 2A) and noted that it varied 34 mv in networks of the invention compared to a range of 205–313 mv for the conventional networks.

A third simulation observed the output current (36 in FIG. 2A) and found that it varied 0.16 mA in networks of the invention compared to a range of 0.6–1 mA for the conventional networks even when the latter networks were sometimes rebiased because their transistors moved out of their correct transistor regions. A fourth simulation observed the tracking between the drain-to-source voltages $V_{ds}$ of the main transistor (21 in FIG. 2A) and its corresponding replica transistor (24 in FIG. 2A). It was observed that they tracked within 30 mV in networks of the invention compared to a range of 205–313 mV for the conventional networks.

A fifth simulation observed a ratio of the change in output resistance to the minimum output resistance at the output port (35 in FIG. 2A) and noted that it was 1.5 in networks of the invention compared to a range of 4–26 for the conventional networks. A final simulation measured the loss in dynamic range and noted that it was less than 30 mV in networks of the invention compared to a range of 300–700 mV for the conventional networks.

In addition, it was noted that the bias of the cascode transistor (22 in FIG. 2A) decreased as the drain-to-source voltage $V_{ds}$ of the main transistor (21 in FIG. 2A) increased. Thus, the networks of the invention tended to preserve headroom (remaining voltage above the output port (35 in FIG. 2A). In contrast, these movements were in the same direction in the conventional networks so that the loss of headroom was compounded.

Although cascode embodiments have been described with the aid primarily of N-type MOS transistors and NPN BJT transistors, the teachings of the invention include embodiments formed primarily with P-type MOS transistors and PNP BJT transistors.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A cascode network, comprising:
   a voltage source;
   a replica transistor;
   a compression transistor coupled between gate and drain of said replica transistor and having a gate coupled to said voltage source;
   a diode-coupled transistor coupled to the drain of said replica transistor; and
   a cascode arrangment of main and cascode transistors that respectively receive a bias from said replica transistor and said diode-coupled transistor.

2. The network of claim 1, wherein said diode-coupled transistor and said cascode transistor are bipolar junction transistors.

3. The network of claim 2, wherein said compression transistor is a bipolar junction transistor.

4. The network of claim 1, wherein said diode-coupled transistor and said cascode transistor are metal-oxide-semiconductor transistors.

5. The network of claim 1, further including current sources respectively coupled to said compression transistor and said diode-coupled transistor.

6. The network of claim 1, wherein said voltage source includes:
   a current source; and
   a second diode-coupled transistor coupled to said current source to provide a voltage reference.

7. The network of claim 1, wherein said voltage source includes:
   stacked first and second diode-coupled transistors; and
   a source-follower transistor that receives a bias from said second diode-coupled transistor and provides a voltage reference.

8. The network of claim 1, wherein said voltage source includes:
   a first bias transistor; and
   a second diode-coupled bias transistor coupled between a gate and drain of said first bias transistor to provide a voltage reference.

9. The network of claim 6, wherein said voltage source further includes a third diode-coupled transistor coupled to the drain of said first bias transistor to provide a voltage reference.

10. The network of claim 1, wherein a second diode-coupled transistor and a source follower transistor are inserted between said diode-coupled transistor and said cascode transistor and said cascode transistor receives its bias via said source follower transistor.

11. The network of claim 1, wherein a second diode-coupled transistor and an emitter follower transistor are inserted between said diode-coupled transistor and said cascode transistor and said cascode transistor receives its bias via said emitter follower transistor.

12. A cascode network, comprising:
    a voltage source;
    a first replica transistor;
    a first compression transistor coupled between gate and drain of said first replica transistor and having a gate coupled to said voltage source;
    a second replica transistor;
    a second compression transistor coupled between gate and drain of said second replica transistor and having a gate coupled to said voltage source;
    a diode-coupled transistor coupled to the drain of said second replica transistor; and
    a cascode arrangment of main and cascode transistors that respectively receive a bias from said first replica transistor and said diode-coupled transistor.

13. The network of claim 12, wherein said diode-coupled transistor and said cascode transistor are bipolar junction transistors.

14. The network of claim 13, wherein said first and second compression transistors are bipolar junction transistors.

15. The network of claim 12, wherein said diode-coupled transistor and said cascode transistor are metal-oxide-semiconductor transistors.

16. The network of claim 12, further including current sources respectively coupled to said first and second compression transistors and said diode-coupled transistor.

17. The network of claim 12, wherein said voltage source includes:
    a current source; and
    a second diode-coupled transistor coupled to said current source to provide a voltage reference.

18. The network of claim 12, wherein said voltage source includes:
    stacked first and second diode-coupled transistors; and
    a source-follower transistor that receives a bias from said second diode-coupled transistor and provides a voltage reference.

19. The network of claim 12, wherein said voltage source includes:
    a first bias transistor; and
    a second diode-coupled bias transistor coupled between a gate and drain of said first bias transistor to provide a voltage reference.

20. The network of claim 19, wherein said voltage source further includes a third diode-coupled transistor coupled to the drain of said first bias transistor to provide a voltage reference.

21. The network of claim 12, wherein a second diode-coupled transistor and a source follower transistor are inserted between said diode-coupled transistor and said cascode transistor and said cascode transistor receives its bias via said source follower transistor.

22. The network of claim 12, wherein a second diode-coupled transistor and an emitter follower transistor are inserted between said diode-coupled transistor and said cascode transistor and said cascode transistor receives its bias via said emitter follower transistor.

23. A cascode network, comprising:
    stacked first and second voltage sources;
    stacked first and second bias circuits;
    a diode-coupled transistor coupled to said second bias circuit; and
    a cascode arrangement of a main transistor with first and second cascode transistors that respectively receive a bias from said first bias circuit, said second bias circuit and said diode-coupled transistor;

wherein said bias circuits each include:
- a replica transistor; and
- a compression transistor coupled between gate and drain of said replica transistor and having a gate coupled to a respective one of said voltage sources.

24. The network of claim 23, further including current sources respectively coupled to said diode-coupled transistor and the compression transistor of said bias circuits.

25. The network of claim 23, wherein each of said voltage sources includes:
- a current source; and
- a second diode-coupled transistor coupled to said current source to provide a voltage reference.

26. The network of claim 23, wherein each of said voltage sources includes:
- a first bias transistor; and
- a second diode-coupled bias transistor coupled between a gate and drain of said first bias transistor to provide a voltage reference.

27. The network of claim 26, wherein each of said voltage sources further includes a third diode-coupled transistor coupled to the drain of said first bias transistor to provide a voltage reference.

28. A cascode network, comprising:
- stacked first and second voltage sources;
- stacked first and second bias circuits;
- stacked third and fourth bias circuits;
- a diode-coupled transistor coupled to said fourth bias circuit; and
- a cascode arrangement of a main transistor with first and second cascode transistors that respectively receive a bias from said first bias circuit, said second bias circuit and said diode-coupled transistor;

wherein said bias circuits each include:
- a replica transistor; and
- a compression transistor coupled between gate and drain of said replica transistor and having a gate coupled to a respective one of said voltage sources.

29. The network of claim 28, further including current sources respectively coupled to said diode-coupled transistor and the compression transistor of said bias circuits.

30. The network of claim 28, wherein each of said voltage sources includes:
- a current source; and
- a second diode-coupled transistor coupled to said current source to provide a voltage reference.

31. The network of claim 28, wherein each of said voltage sources includes:
- a first bias transistor; and
- a second diode-coupled bias transistor coupled between a gate and drain of said first bias transistor to provide a voltage reference.

32. The network of claim 28, wherein each of said voltage sources further includes a third diode-coupled transistor coupled to the drain of said first bias transistor to provide a voltage reference.

* * * * *